United States Patent [19]
Jun

[11] Patent Number: 5,837,604
[45] Date of Patent: Nov. 17, 1998

[54] METHOD FOR FORMING INTERCONNECTION OF SEMICONDUCTOR DEVICE

[75] Inventor: Young Kwon Jun, Seoul, Rep. of Korea

[73] Assignee: LG Semicon Co., Ltd., Chungcheongbuk-do, Rep. of Korea

[21] Appl. No.: 698,699

[22] Filed: Aug. 16, 1996

[30] Foreign Application Priority Data

Dec. 19, 1995 [KR] Rep. of Korea .................. 1995/52205

[51] Int. Cl.⁶ .................................................. H01L 21/441
[52] U.S. Cl. ........................ 438/641; 438/669; 438/657; 438/688
[58] Field of Search ...................... 437/195, 191, 437/245, 957; 427/69; 438/641, 674, 669, 670, 657, 688, 660, 647, 648

[56] References Cited

U.S. PATENT DOCUMENTS

| | | | |
|---|---|---|---|
| 5,045,494 | 9/1991 | Choi et al. | 438/256 |
| 5,084,403 | 1/1992 | Matsuoka | 438/607 |
| 5,151,305 | 9/1992 | Matsumoto et al. . | |
| 5,180,687 | 1/1993 | Mikoshiba | 438/675 |
| 5,262,361 | 11/1993 | Cho et al. | 437/245 |
| 5,374,591 | 12/1994 | Hasegawa et al. . | |
| 5,466,638 | 11/1995 | Eguchi | 437/193 |

FOREIGN PATENT DOCUMENTS 1-101648 4/1989 Japan .

*Primary Examiner*—Caridad Everhart

[57] ABSTRACT

A method for forming an interconnect of a semiconductor device including the steps of: sequentially forming an interlevel insulating layer and auxiliary layer on a substrate supporting a lower conductive line; doping impurity ions into the auxiliary layer, and selectively removing the auxiliary layer and interlevel insulating layer to thereby form a contact hole sufficient to the lower conductive line; and depositing and growing a conductive material in the contact hole and on the auxiliary layer to thereby form an upper conductive line.

16 Claims, 10 Drawing Sheets

METHOD FOR FORMING INTERCONNECTION OF SEMICONDUCTOR DEVICE

BACKGROUND OF THE INVENTION

The present invention relates to a method for fabricating a semiconductor device, and more particularly, to a method for forming an interconnection of a semiconductor device in which impurities are prevented from infiltrating into the interface of upper and lower conductive lines, to thereby improve the contact resistance and reliability of a semiconductor device.

Generally, aluminum and aluminum alloy have a high conductivity and excellent adhesion with a silicon oxide, and are easily formed into a pattern through dry etching. Also, both materials are relatively low in price. Due to these reasons, aluminum and aluminum alloy have been widely used as an interconnect material in semiconductor integrated circuits.

Meanwhile, as the density of the semiconductor integrated circuit increases, its size is reduced, and its interconnection becomes fine and multi-layered. Accordingly, the step coverage of the interconnection layer becomes important in a portion having an overlapping topography, or a contact hole or a via hole. That is, in, the case in which the interconnection is formed using a physical deposition method like sputtering, a conventional method for forming an interconnection of a semiconductor device, the thickness of the interconnecting layer is locally thin on a portion having an uneven surface due to the shadow effect. This phenomenon remarkably appears in a contact hole having an aspect ratio of over 1.

For this reason, a chemical vapor deposition (CVD) method capable of depositing materials at a uniform thickness is used instead of the above physical deposition method. Studies have been conducted in which a tungsten layer is formed through a low pressure chemical vapor deposition (LPCVD) to thereby improve the step coverage. However, it is difficult to use the tungsten layer as an interconnecting layer because the tungsten layer has a resistance twice that of an aluminum layer. To overcome this problem, a method for forming a plug in a contact hole has proposed. If an interconnecting layer is formed of aluminum as main constituent element through CVD, its step coverage is improved, and at the same time, a process for forming the aluminum interconnecting layer using a conventional sputtering is capable of having the continuity to its related processes. Accordingly, studies are actively carried out in which the aluminum layer is formed using LPCVD.

The aluminum layer is formed using an aluminum source, such as triisobutylaluminum (TIBA), trimethylaluminum (TMA), trimethylaminealane (TMAA), dimethylaluminum (DMAH) or dimethylethylaminealane (DMEAA). A conventional method for forming an interconnect in a semiconductor device will be explained below with reference to technology disclosed in U.S. Pat. No. 5,151,305. This technology is related to improving the deposition rate of aluminum, and preventing carbon or impurities from infiltrating into the interconnect layer during formation of the aluminum layer using CVD.

In order to prevent impurities from infiltrating the interconnect layer, a two-step deposition process provides the steps of selectively depositing and non-selectively depositing aluminum using a multi-chamber arrangement. That is, aluminum is selectively deposited in a contact hole, and thereafter, aluminum used as a wiring material is non-selectively deposited. Here, during the selective deposition step, DMAH and $H_2$ gas surface-react with each other at a low temperature to selectively deposit the aluminum in the contact hole.

As described above, the conventional method for forming an interconnect in a semiconductor device was designed to prevent impurities from infiltrating into the interface of the selectively deposited aluminum and a upper conductive line, and to improve the contact resistance of the device when the aluminum plug is selectively deposited in the contact hole and the upper conductive line is formed by the aluminum layer through CVD. However, in the above conventional method, impurities nonetheless infiltrate the interface of the plug selectively formed in the contact hole, and the upper conductive line. This increases the contact resistance of the semiconductor device, and deteriorates the reliability of the device.

SUMMARY OF THE INVENTION

It is an object of the present invention to provide a method for forming an interconnection of a semiconductor device in which a plug and upper conductive line are sequentially grown, to thereby prevent impurities from infiltrating into the interface of the plug and upper conductive line, and accordingly, improve the contact resistance and reliability of the semiconductor device.

To accomplish the primary object of the present invention, there is provided a method for forming an interconnect in a semiconductor device in which a contact hole is formed on a lower conductive line, a conductive plug is formed in the contact hole, and then a upper conductive line is formed to be connected to the conductive plug, in which the conductive plug and upper conductive line are formed simultaneously.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

DETAILED DESCRIPTION OF THE INVENTION

Figure 1A:
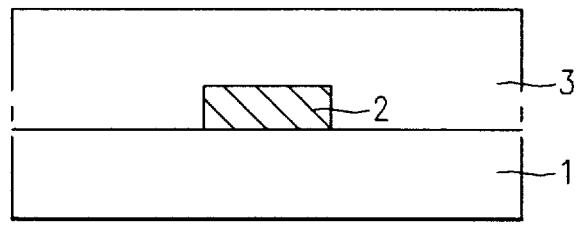
FIGS. 1A to 1H are cross-sectional views showing a method for forming an interconnect in a semiconductor device in accordance with a first embodiment of the present invention.

Preferred embodiments of the present invention will be explained below with reference to the accompanying drawings. FIGS. 1A to 1H are cross-sectional views showing a method for forming an interconnect in a semiconductor device in accordance with a first embodiment of the present invention. As shown in FIG. 1A, a lower conductive line 2 is formed on a predetermined portion of a semiconductor substrate 1, and then a silicon oxide 3 is deposited through CVD, to form an interlevel insulating layer.

Figure 1B:
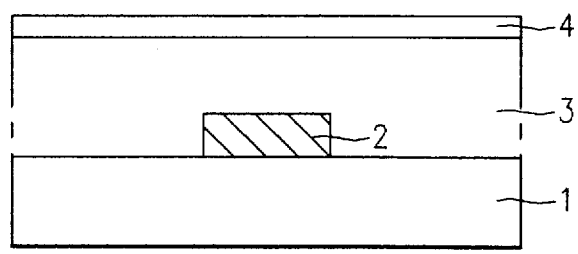
Figure 1C:
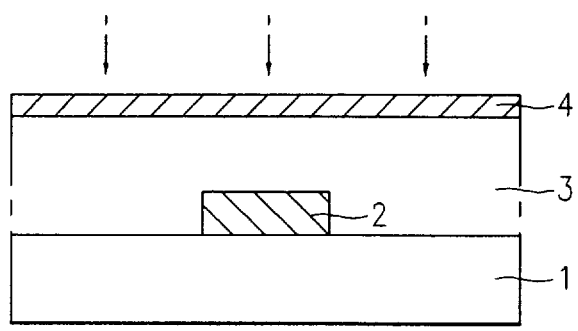

As shown in FIG. 1B, an auxiliary layer 4 for forming a nucleus is formed on the silicon oxide layer 3. Here, the auxiliary layer is formed of a semiconductor like Si or Ge, metal like Ti or W, or metal compound like TiN, TiW or $WSi_2$. Then, as shown in FIG. 1C, impurity ions 7, for example, Si or N, are doped into the auxiliary layer 4 using plasma or ion-implantation. Here, impurity ions are doped at a dose of about $10^{12}$–$10^{14}$ ions/cm². The amount of impurity ions may be adjusted in order to obtain a nucleus-generating rate different from that on the lower conductive line when conductive material is selectively deposited during the successive process for forming an upper conductive line.

Figure 1D:
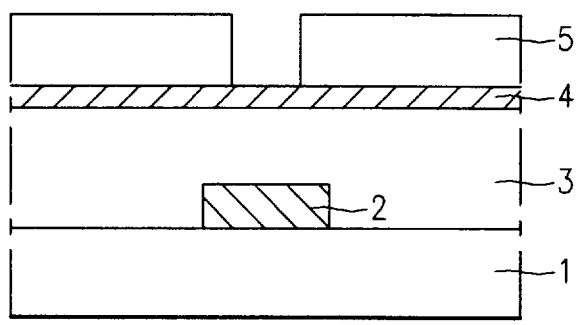
Figure 1E:
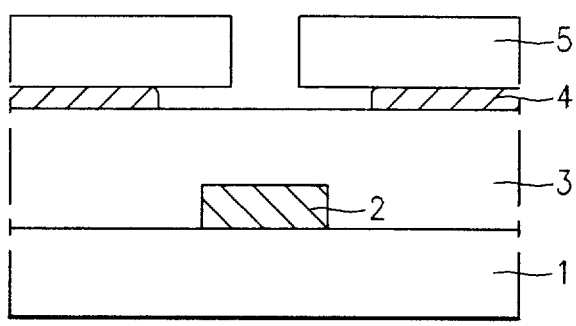

As shown in FIG. 1D, photoresist 5 is coated on the ion-doped auxiliary layer 4, and then patterned to expose a predetermined portion of the auxiliary layer 4 in order to form a contact hole. As shown in FIG. 1E, the exposed portion of auxiliary layer 4 is wet etched using the patterned photoresist 5 as a mask. According to the wet etch, an under-cut of auxiliary layer 4 is formed beneath the patterned photoresist 5. Here, the under-cut is for the purpose of preventing a thin seam from being formed in an upper portion of a plug. The thin seam is caused by the formation of an overhang on the upper portion of a contact hole when conductive material for forming an upper interconnection is selectively deposited during the successive steps of the process to follow.

Figure 1F:
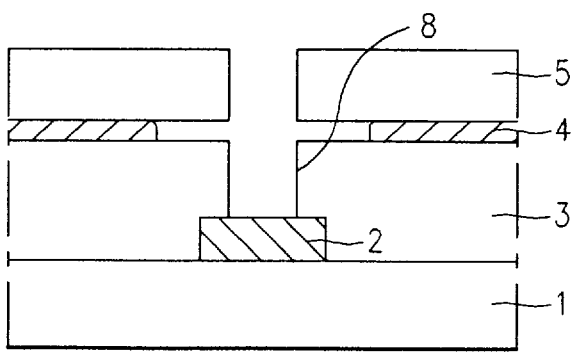
Figure 1G:
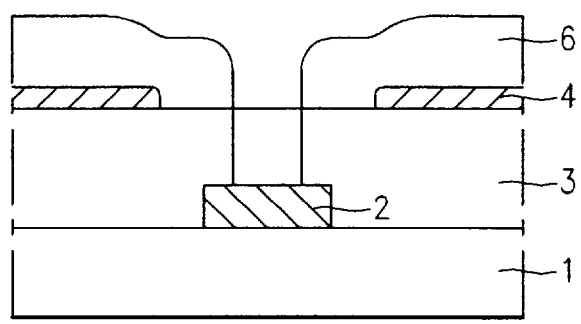

As shown in FIG. 1F, portions of the silicon oxide layer 3 are selectively removed using the patterned photoresist 5 as a mask, to thereby form a contact hole 8 and accordingly to expose a predetermined portion of the lower conductive line 2. Then, as shown in FIG. 1G, the patterned photoresist 5 is removed, and conductive material 6 is deposited on auxiliary layer 4 including the contact hole. Here, the conductive material 6 is deposited to fill the contact hole 8, so that the conductive material which is grown on auxiliary layer 4 does not overhang onto the upper surface of the silicon oxide layer 3. The above discussed impurity ion doping and under cut forming process steps should be properly adjusted to preclude any overhang.

Figure 1H:
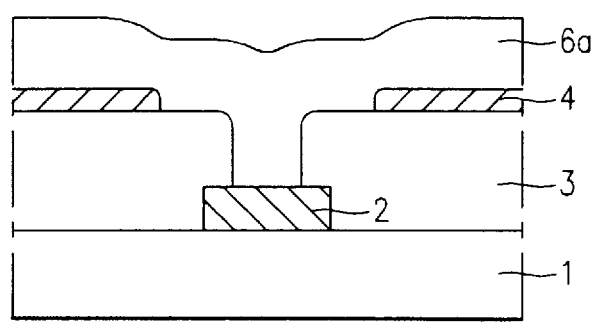

Then, as shown in FIG. 1H, conductive material 6 is successively grown. When conductive material 6 is successively grown on auxiliary layer 4, a selected portion of conductive material layer 6 is removed to thereby form the upper conductive line 6a.

FIGS. 2A to 2F are cross-sectional views showing a method for forming an interconnect in a semiconductor device in accordance with a second embodiment of the present invention. In the second embodiment of the present invention, the surface of a lower conductive line is recrystallized to grow the particle size of the lower conductive line, and then conductive material is selectively grown on the surface of the lower conductive line, to thereby form the interface of the lower conductive line and a upper conductive line as an epitaxial layer.

Figure 2A:
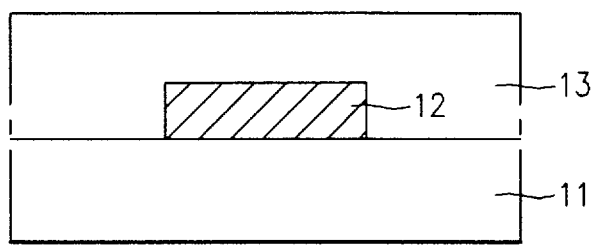
FIGS. 2A to 2F are cross-sectional views showing a method for forming an interconnect in a semiconductor device in accordance with a second embodiment of the present invention.
Figure 2B:
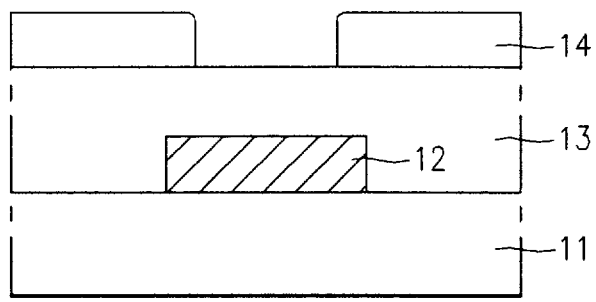

As shown in FIG. 2A, a lower conductive line 12 is formed on a predetermined portion of a semiconductor substrate 11, and a silicon oxide layer 13 is deposited on the overall surface of substrate 11 including the lower conductive line 12 through CVD, to form an interlevel insulating layer. As shown in FIG. 2B, photoresist 14 is coated on the silicon oxide layer 13, and then patterned to form a contact hole.

Figure 2C:
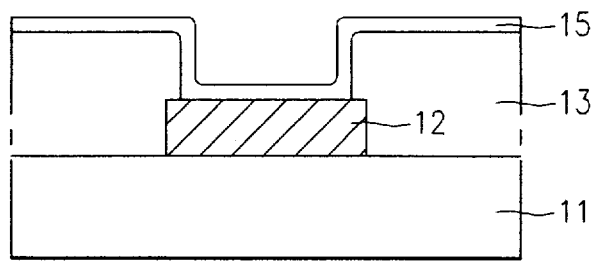

As shown in FIG. 2C, the silicon oxide layer 13 is selectively etched using the patterned photoresist 14 as a mask, to form a contact hole 18 and expose a portion of the surface of the lower conductive line 12. Then, an auxiliary layer 15 for forming a nucleus is formed on the exposed lower conductive line 12 and the silicon oxide layer 13. Here, the auxiliary layer 15 is formed of a semiconductor like Si or Ge, a metal like Ti or W, or a metal compound like TiN, TiW or $WSi_2$. Auxiliary layer 15 is formed at a thickness of below 100 Å on lower conductive line 12. By doing so, the auxiliary layer 15 on the lower conductive line 12 is at least locally fused into the lower conductive line 12 during a later heat treatment described hereinafter.

Figure 2D:
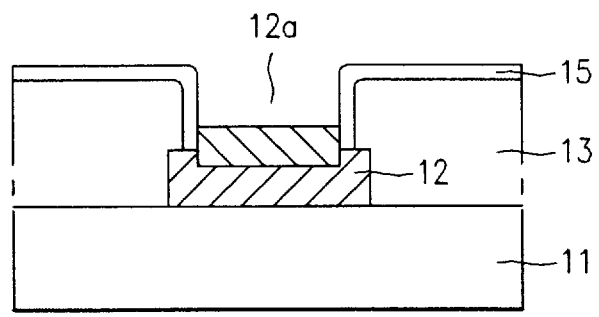

As shown in FIG. 2D, the substrate is heat-treated at the temperature of 250°–450° C. in the ambient environment of an activated gas like $H_2$ or $N_2$, or an inert gas. By doing so, the average surface particle of the lower conductive line 12 in the contact hole increases in diameter to above 0.5 $\mu$m, and at the same time, auxiliary layer 15, being in contact with the surface of the lower conductive line 12, is locally fused into the lower conductive line 12, to thereby selectively expose the surface of the lower conductive line 12 in the contact hole. Also, the surface of lower conductive line 12 is recrystallized to increase the particle size of the lower conductive line 12.

Figure 2E:
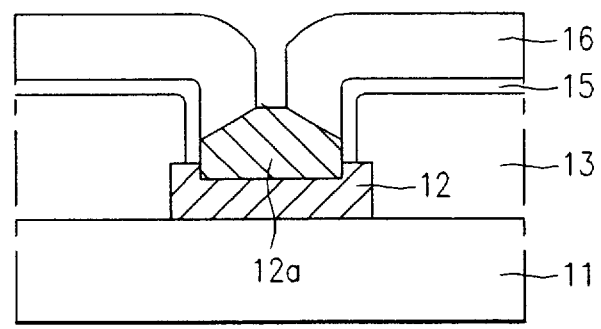
Figure 2F:
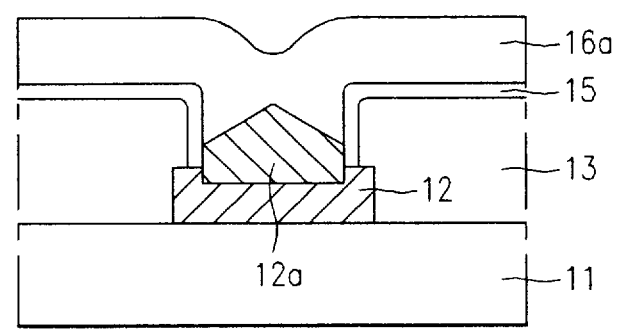

As shown in FIG. 2E, conductive material 16 is deposited on auxiliary layer 15 and on the recrystallized lower conductive line 12a. Here, since the particle size of the conductive line 12a is selectively grown on the surface of the lower conductive line 12, if the conductive material 16 is grown on the lower conductive line 12a, an upper conductive line 16a is epitaxially grown with respect to the lower conductive line 12a, as shown in FIG. 2F. Conductive material 16 is successively grown on the auxiliary layer 15, and then the conductive material layer is patterned using a predetermined pattern to form an upper conductive line 16a. Instead of the deposition of material on the auxiliary layer, it is possible that an impurity ion like Si or Ti is doped into the lower conductive line through plasma or ion-implantation. Here, the amount of the impurity is $10^{12}$–$10^{14}$ ions/cm². By doing so, when the surface of the lower conductive line is recrystallized to grow the size of the particle during successive heat treatment, the impurity ion doped layer becomes a seed layer.

FIGS. 3A to 3G are cross-sectional views showing a method for forming an interconnect of a semiconductor device in accordance with a third embodiment of the present invention. In the third embodiment of the present invention, an auxiliary layer is selectively formed on the exposed surface of a lower conductive line, to form a reaction layer of the auxiliary layer and lower conductive line. The reaction layer is selectively removed through a heat treatment, and then conductive material selectively grown.

Figure 3A:
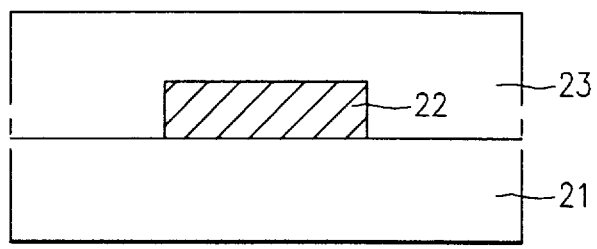
FIGS. 3A to 3G are cross-sectional views showing a method for forming an interconnect in a semiconductor device in accordance with a third embodiment of the present invention.
Figure 3B:
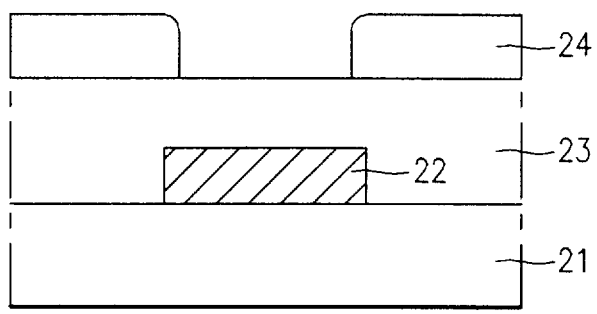

As shown in FIG. 3A, a lower conductive line 22 is formed on a predetermined portion of a semiconductor substrate 21, and a silicon oxide layer 23 is formed as an interlevel insulating layer on the overall surface of substrate 21 through CVD. As shown in FIG. 3B, photoresist 24 is coated on silicon oxide layer 23, and then patterned to form a contact hole for electrically connecting lower conductive line 23 to an upper conductive line to be formed in the following process.

Figure 3C:
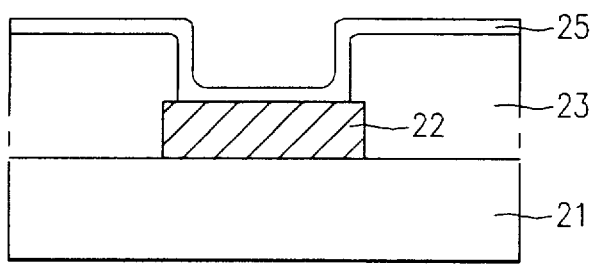

As shown in FIG. 3C, a portion of the silicon oxide layer 23 is selectively removed to expose a predetermined portion of the surface of the lower conductive line 22 using the patterned photoresist 24 as a mask. Then, an auxiliary layer 25 is formed on the exposed lower conductive line 22 and on the silicon oxide layer 23, to form a nucleus. Here, auxiliary layer 25 is formed of a semiconductor like Si or Ge, a metal like Ti or W, or a metal compound like TiN, TiW or $WSi_2$. Auxiliary layer 15 is formed with a thickness of above 50 Å on the lower conductive line 12. By doing so, auxiliary layer 25 on lower conductive line 22 is at least locally fused into the lower conductive line 22 during successive heat treatment.

Figure 3D:
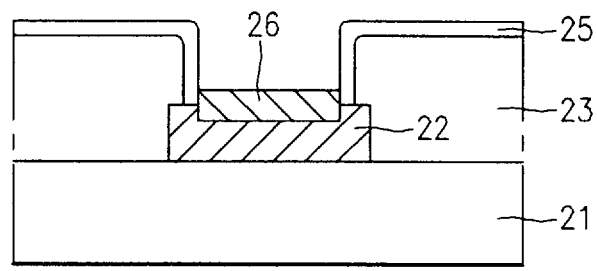

As shown in FIG. 3D, the substrate is heat-treated at the temperature of 250°–450° C. in the ambient environment of an activated gas like $H_2$ or $N_2$, or an inert gas. By doing so, the average surface particle of the lower conductive line 22 in the contact hole becomes about 0.5 μm. Here, auxiliary layer 25 on the surface of lower conductive line 22 is at least locally fused into the lower conductive line 22, and at the same time, lower conductive line 22 in the contact hole and auxiliary layer 25 react with each other, to form a reaction layer 26 on the interface between the two layers. The surface of lower conductive line 22 is recrystallized to increase its particle size.

Figure 3E:
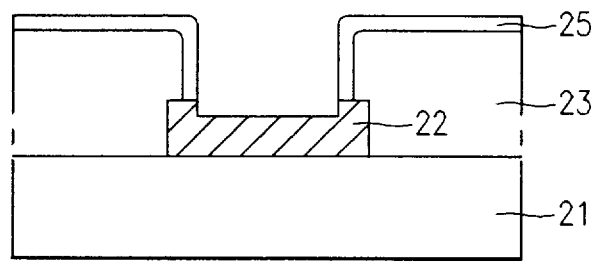

As shown in FIG. 3E, reaction layer 26, which is formed on the interface of the auxiliary layer 25 in the contact hole and lower conductive line 22, is selectively removed. By doing so, a portion of the surface of the lower conductive line 22 is exposed, in which its particle size is increased by the recrystallizing.

Figure 3F:
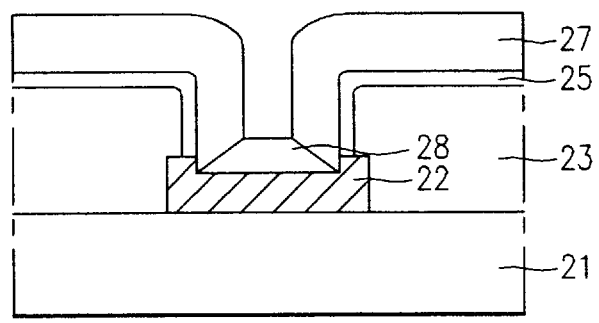
Figure 3G:
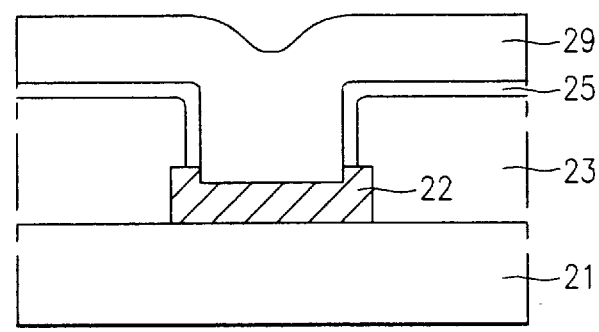

As shown in FIG. 3F, conductive material 27 is deposited on auxiliary layer 25 and lower conductive line 22 in the contact hole. Here, since the particle size of the conductive line is selectively grown on the surface of lower conductive line 22, if conductive material is grown on the lower conductive line 22, an upper conductive line is epitaxially grown with respect to lower conductive line 22, to thereby form an epitaxial layer 28. Then, as shown in FIG. 3G, conductive material 27 is successively grown on auxiliary layer 25, and then the conductive material layer is patterned using a predetermined pattern, to form an upper conductive line 29.

FIGS. 4A to 4F are cross-sectional views showing a method for forming an interconnect in a semiconductor device in accordance with a fourth embodiment of the present invention. In the fourth embodiment of the present invention, a plug to be formed in a contact hole is grown in single-crystalline semiconductor, to thereby improve the contact hole and reliability of the semiconductor device.

Figure 4A:
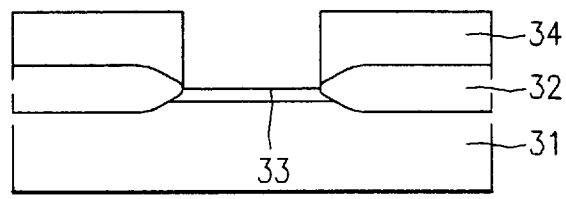
FIGS. 4A to 4F are cross-sectional views showing a method for forming an interconnect in a semiconductor device in accordance with a fourth embodiment of the present invention.

As shown in FIG. 4A, a field region and active region are defined on a single-crystalline semiconductor substrate 31, and a field oxide layer 32 is formed on the field region. Impurities are ion-implanted into the substrate to form an impurity diffusion layer 33 on the active region. Then, a silicon oxide layer 34 as an interlevel insulating layer is formed on the overall surface of the substrate. Successively, photoresist (not shown) is coated on the silicon oxide layer 34, and then patterned. A portion of the silicon oxide layer 34 is selectively removed to expose the impurity diffusion layer 33 using the patterned photoresist to form a contact hole for the purpose of forming an auxiliary plug.

Figure 4B:
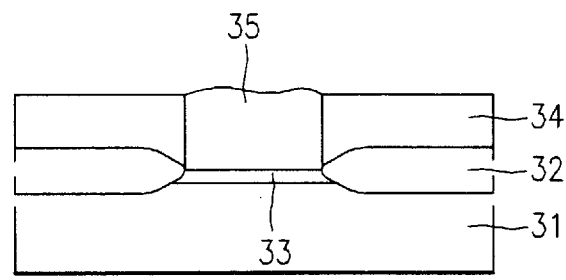
Figure 4C:
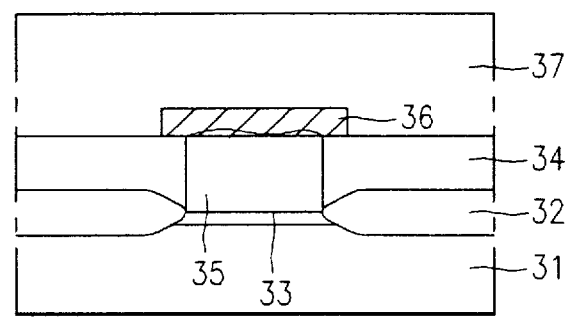

As shown in FIG. 4B, conductive material is epitaxially grown using the exposed single-crystalline semiconductor substrate 31 in the contact hole as a seed layer, to form a single-crystalline auxiliary plug. Then, as shown in FIG. 4C, a lower conductive line pattern 36 is formed on an auxiliary plug 35 and partially on the silicon oxide layer 34, and an interlevel insulating layer 37 is formed on the patterned lower conductive line 36.

Figure 4D:
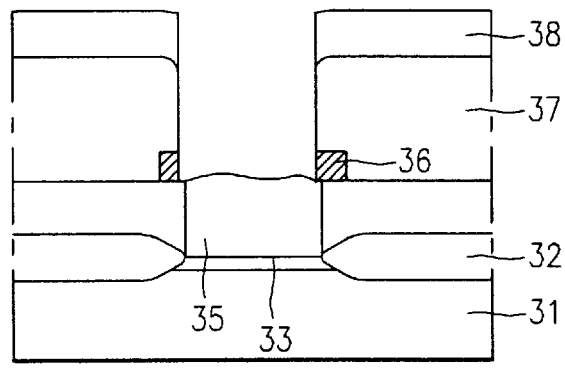

As shown in FIG. 4D, photoresist is coated on the interlevel insulating layer 37, and then patterned. Portions of the interlevel insulating layer 37 and lower conductive line 36 are selectively removed using the patterned photoresist 38 as a mask, to thereby form a contact hole to be connected to auxiliary plug 35. By doing so, the surface of the auxiliary plug 35 formed of single-crystalline is exposed in the contact hole.

Figure 4E:
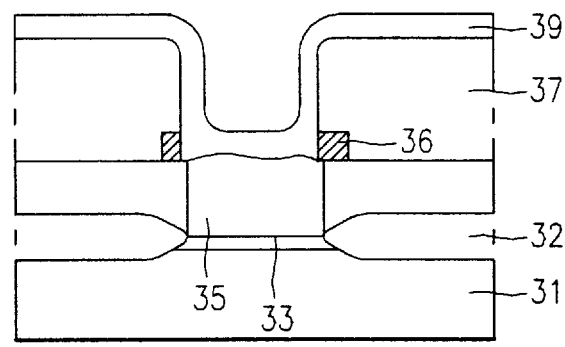
Figure 4F:
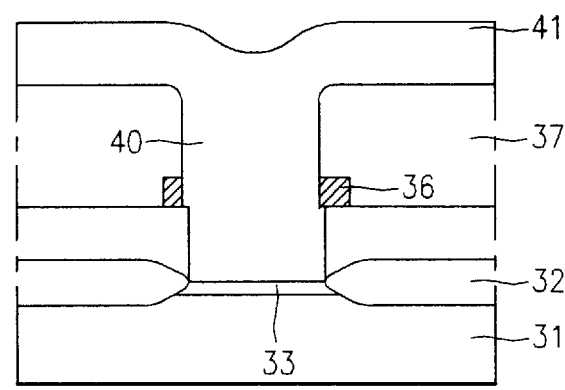

As shown in FIG. 4E, if the photoresist 38 is removed and conductive material 39 is deposited on interlevel insulating layer 37 and auxiliary plug 35 in the contact hole, conductive material is epitaxially grown with respect to the auxiliary plug 35 to form a single-crystalline plug 40 and upper conductive line 41 which are grown successively.

The above present invention has the following advantages. First, the plug and conductive line are successively formed to thereby prevent the interface of the plug and conductive line from being exposed thus to block the infiltration of impurities into the interface and to simplify the process. Secondly, the interface of the lower and upper conductive lines is epitaxially grown. This decreases the contact resistance and reduces the whole grain boundary area of the plug thereby improving the reliability. Thirdly, the upper conductive line is epitaxially grown with respect to the auxiliary plug to be formed in single-crystalline semiconductor. This improves the contact resistance and reliability of the device resulting in enhancement of the characteristics of the interconnect.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming an interconnect of a semiconductor device comprising the steps of:

sequentially forming an interlevel insulating layer and auxiliary layer on a substrate supporting a lower conductive line;

doping impurity ions into said auxiliary layer; selectively removing portions of said auxiliary layer and interlevel insulating layer to thereby form a contact hole exposing a portion of said lower conductive line such that an inner edge of the auxiliary layer is spaced from the sidewalls of the contact hole as formed in the interlevel insulating layer; and depositing and growing a conductive material in said contact hole and on said auxiliary layer to thereby form an upper conductive line.

2. The method for forming an interconnect of a semiconductor device as claimed in claim 1, wherein said sequentially forming step further comprises forming said auxiliary layer from one of the group consisting of a semiconductor, a metal and a metal compound.

3. The method for forming an interconnect of a semiconductor device as claimed in claim 1, wherein said sequentially forming step further comprises forming said auxiliary layer from one of the materials from the group consisting of Si, Ge, Ti, W, TiN, TiW, and $WSi_2$.

4. The method for forming an interconnect of a semiconductor device as claimed in claim 1, wherein said ion-doping step includes doping said auxiliary layer using plasma or ion-implantation.

5. The method for forming an interconnect of a semiconductor device as claimed in claim 1, wherein said doping step includes doping the auxiliary layer at a concentration of $10^{12}$–$10^{14}$ dose/cm$^2$.

6. The method for forming an interconnect of a semiconductor device as claimed in claim 1, wherein said removing step further comprises wet etching said the auxiliary layer, and dry etching said interlevel insulating layer in forming said contact hole.

7. The method for forming an interconnect of a semiconductor device as claimed in claim 1, wherein said step of depositing and growing said conductive material in said contact hole and on said auxiliary layer includes growing the conductive material by selective epitaxy growth.

8. The method for forming an interconnect of a semiconductor device as claimed in claim 1, wherein said step of forming the auxiliary layer further comprises forming the auxiliary layer to have a thickness of less than 100 Å on the surface of said lower conductive line.

9. A method for forming an interconnect of a semiconductor device comprising the steps of:

forming an interlevel insulating layer on a substrate which supports a lower conductive line, and selectively removing the interlevel insulting layer to thereby form a contact hole on in the interlevel insulating layer sufficient to partially expose said lower conductive line;

doping impurities into said lower conductive line;

heat treating an exposed surface of said lower conductive line to recrystallize the exposed surface; and depositing and epitaxially growing a conductive material, to thereby form a conductive plug and upper conductive line.

10. The method for forming an interconnect of a semiconductor device as claimed in claim 9, wherein said doping step further comprises doping with one of the impurities from the group consisting of Si or Ti, and the concentration of said impurity is $10^{12}$–$10^{14}$ dose/cm$^2$.

11. A method for forming an interconnect of a semiconductor device comprising the steps of:

forming an interlevel insulating layer on a substrate supporting a lower conductive line, and selectively removing the interlevel insulating layer to form a contact hole through the interlevel insulating layer sufficient to partially expose said lower conductive line;

forming an auxiliary layer on said interlevel insulating layer which covers said contact hole;

heat treating said lower conductive line to recrystallize the surface at an interface with the auxiliary layer, and forming a reaction layer at the interface between said auxiliary layer and lower conductive line;

selectively removing said reaction layer; and depositing and epitaxially growing a conductive material on said lower conductive layer and auxiliary layer, with respect to said lower conductive line, to thereby form a conductive plug and upper conductive line.

12. The method for forming an interconnect of a semiconductor device as claimed in claim 11, wherein said step of heat treating further comprises forming the auxiliary layer by heat treating the exposed surface of the lower conductive line in an ambient environment of an activated or an inert gas.

13. The method for forming an interconnection of a semiconductor device as claimed in claim 12, wherein said heat treating step further comprises heating at a temperature of 250° C.–450° C.

14. The method for forming an interconnect of a semiconductor device as claimed in claim 11, wherein said step of forming said auxiliary layer includes forming the auxiliary layer to have a thickness of greater than 50A on said lower conductive line.

15. A method for forming an interconnect of a semiconductor device comprising the steps of:

forming a first interlevel insulating layer on a substrate supporting an impurity diffusion region;

selectively removing said first interlevel insulating layer to form a first contact hole through the first interlevel insulating layer sufficient to partially expose said impurity diffusion region;

epitaxially growing the impurity diffusion region in said first contact hole, to form a first conductive plug;

forming a lower conductive line on the first conductive plug;

forming a second interlevel insulating layer on said first interlevel insulating layer and on said lower conductive line, and then forming a second contact hole through said second interlevel insulating layer and said lower conductive line sufficient to expose said first conductive plug; and depositing and epitaxially growing a conductive material, on said second interlevel insulting layer and in said second contact hole, to thereby form a second conductive plug and upper conductive line.

16. The method for forming an interconnect of a semiconductor device as claimed in claim 15, wherein both said growing steps include growing said first and second conductive plugs respectively, in single-crystalline semiconductor.

* * * * *